United States Patent [19]

Kimura et al.

[11] Patent Number: 5,779,081
[45] Date of Patent: Jul. 14, 1998

[54] CERAMIC PACKAGE LID HAVING METALLIZED LAYER WITH VARYING WIDTHS

[75] Inventors: Kazuo Kimura; Haruhiko Murata; Yukihiro Aoyama, all of Nagoya, Japan

[73] Assignee: NGK Spark Plug Co., Ltd., Nagoya, Japan

[21] Appl. No.: 731,379

[22] Filed: Oct. 10, 1996

Related U.S. Application Data

[63] Continuation of Ser. No. 283,897, Aug. 3, 1994, abandoned.

[30] Foreign Application Priority Data

Aug. 3, 1993 [JP] Japan ............................ 5-212385

[51] Int. Cl.$^6$ ............................................ B65D 53/00
[52] U.S. Cl. .................. 220/200; 174/50.5; 174/50.51; 228/124.6; 220/359
[58] Field of Search .................. 220/200, 220, 220/DIG. 13, DIG. 29, DIG. 31, 359; 174/50, 50.5, 50.61, 50.63, 52.4, 52.6, 52.1; 437/218; 361/816, 818; 277/235 A, 234; 228/124.6, 251, 124.1, 215

[56] References Cited

U.S. PATENT DOCUMENTS

| | | | |
|---|---|---|---|
| 2,882,116 | 4/1959 | Williams | 228/124.6 X |
| 4,105,861 | 8/1978 | Hascoe | 174/52.4 |
| 4,291,815 | 9/1981 | Gordon et al. | |
| 4,331,253 | 5/1982 | Gordon et al. | |
| 4,356,047 | 10/1982 | Gordon et al. | |
| 4,603,374 | 7/1986 | Wasielewski | 257/730 X |
| 4,626,960 | 12/1986 | Hamano et al. | 361/388 |
| 4,640,438 | 2/1987 | Trevison et al. | 220/200 X |
| 4,721,315 | 1/1988 | Ueta | 277/236 X |
| 4,746,583 | 5/1988 | Falanga | |
| 4,833,102 | 5/1989 | Byrne et al. | 174/50.51 X |
| 4,923,825 | 5/1990 | Blouke et al. | 257/701 X |
| 5,057,905 | 10/1991 | Matsumoto et al. | 257/701 X |
| 5,151,773 | 9/1992 | Matsui et al. | 257/730 X |
| 5,300,809 | 4/1994 | Nakamura et al. | 257/730 X |
| 5,323,058 | 6/1994 | Moriga | 257/704 |

FOREIGN PATENT DOCUMENTS

| | | |
|---|---|---|
| 60-115247 | 6/1985 | Japan. |
| 62-136054 | 6/1987 | Japan. |
| 1187839 | 7/1989 | Japan. |
| 2250359 | 10/1990 | Japan. |

OTHER PUBLICATIONS

Walter M. C. Yang, "Preflow Solder Ceramic Lids for Hermetic Packages", Solid State Technology, vol. 27, No. 12, Dec. 1984, pp. 137–143.

*Primary Examiner*—Allan N. Shoap
*Assistant Examiner*—Robin A. Hylton
*Attorney, Agent, or Firm*—Foley & Lardner

[57] ABSTRACT

In a ceramic lid for a semiconductor package, a metallized layer is generally uniform in width and has at least one increased or reduced width portion or a plurality of increased or reduced width portions which are arranged in intervals.

7 Claims, 6 Drawing Sheets

CERAMIC PACKAGE LID HAVING METALLIZED LAYER WITH VARYING WIDTHS

This application is a continuation of application Ser. No. 08/283,897, filed Aug. 3, 1994, now abandoned.

BACKGROUND OF THE INVENTION

1. Field of the Invention

The present invention relates in general to hermetic sealing of semiconductor chips, and more particularly to a ceramic lid to be formed with an integral heat fusible layer for hermetic sealing of a package containing a semiconductor chip.

2. Background of the Invention

An example of a prior art ceramic lid of the above described kind is shown in FIGS. 12A to 14. As shown in FIG. 12A, the lid includes a ceramic substrate 51 which is formed with a flat solder layer 54 at the peripheral region facing a package base 52 and by way of a metallized layer 53. Hermetic sealing is attained by placing the lid on the package base 52 in such a manner that the solder layer 54 fittingly contact the metallized layer 55 of the package base 52 and, under this condition, heating them up to a predetermined temperature for thereby soldering them together. A similar ceramic lid is disclosed in Japanese Patent Provisional Publication No. 57-160147 and Japanese Patent Secondary Publication No. 3-76784.

The solder, when heated up to a solidus line temperature, starts melting and is reduced to a semiliquid state and, when heated beyond a liquidus line temperature, reduced to a completely liquid state. The hermetic sealing is thus carried out at a temperature slightly higher than the liquidus line temperature, which temperature will be referred to hereinafter as "soldering temperature" or "hermetic sealing temperature".

When the solder 54 on the lid disposed in place on the package base 52 is heated up to a solidus line temperature and starts melting, it also effects a sealing action (i.e., also serves as a sealing material), so that at this stage of the hermetic sealing the inside of the package is put into an almost hermetically sealed condition. Under such a sealed condition, the package is further heated up to a hermetic sealing temperature.

Due to this, the pressure inside the package heated up to the hermetic sealing temperature becomes so high that the solder in a liquid or semiliquid state is urged outward (i.e., toward the outside of the package) and is spread outside, though the amount of spread solder varies according to the case, causing a problem that some portions 56 of the spread solder are stick to external leads 57, etc. In case the above described prior art lid is used for hermetic sealing of the package, a defective package having a serious defect is liable to be produced, resulting in a high yield loss and therefore a high cost.

In order to solve this problem, it is considered that, as shown in FIGS. 13 and 14, the solder layer 64 at the peripheral region of the ceramic substrate may be formed with a plurality of grooves 65 so as to provide communication between the inside and the outside of the package when the lid 61 is placed on the package base. By this, even at the stage wherein the solder is melted and reduced to a semiliquidus state, the inside of the package is not sealingly closed at once, thus making it possible to discharge the expanded gas to the outside and thereby preventing the spreading of the solder.

The grooves 65 of the solder layer 64 are formed in the following manner. Firstly, a metallized layer 63 of a predetermined width is formed on the periphery of the lower side surface and the circumferential surface of the ceramic substrate of the lid 61. Then, in case of forming the solder layer by, for example, a dipping process, the ceramic substrate formed with the metallized layer 63 is immersed in a molten solder to allow the solder to stick only to the metallized layer and be cooled and solidified. Thereafter, a male die having a shape reversal to the groove 65 is placed on the solder layer 64 to extend across the same and pressed against the solder layer 64 to form the groove 65. Accordingly, in this method, a pressing process is necessitated in addition to the process for forming the solder layer 64, thus resulting in the necessity of an increased number of processes and a higher cost as compared with the lid having a flat solder layer (i.e., the lid with its solder layer being flat and not formed with any groove). In this connection, a hot knife may be used for partially heating and melting the solder layer 64 in the places where the grooves 65 to be formed. In such a case, damages of the solder layer 64 due to oxidation, biting, etc. thereof are liable to be caused, causing a problem that the quality of the lid 61 is liable to be lowered.

Further, in the case of forming the solder layer by screen printing and reflowing of a solder paste, a die having a shape reversal to the groove (in the form of a bar and made of stainless steel or ceramic) is held in a condition of being pressed against the printed paste during the reflowing so that the die in the form of a bar bites into the solder layer during the reflowing of the printed paste, thus causing a problem that it costs much time and labor as compared with the lid having a flat solder layer. Further, in case of forming the solder layer by reflowing of a solder preform, it is necessary to keep a die pressed against the preform during the reflowing, thus costing much time and labor similar to the above.

That is, in the above described prior art methods, it is necessary to first form a flat solder layer on a metallized layer having been formed around the periphery of the ceramic substrate and thereafter form the grooves in an independent process therefor or a particular work is necessary in the process for forming a solder layer, thus requiring an increased number of processes and an increased manufacturing cost as compared with a lid having a flat solder layer.

SUMMARY OF THE INVENTION

According to an aspect of the present invention, there is provided a novel and improved ceramic lid for a semiconductor package. The ceramic lid comprises a ceramic substrate having a peripheral region defining a hermetic sealing area, and a metallized layer formed on the peripheral region of the ceramic substrate as an undercoat for forming thereon a solder layer for hermetic sealing of the package. The metallized layer is generally uniform in width and has at least one increased or reduced width portion.

According to another aspect of the present invention, the metallized layer is generally uniform in width and has a plurality of increased or reduced width portions which are arranged with intervals.

According to a further aspect of the present invention, the metallized layer is made up of a plurality of larger and smaller width portions which are arranged alternately.

According to a further aspect of the present invention, there is provided a method of producing a ceramic lid for a semiconductor package. The ceramic lid includes a ceramic substrate having a peripheral region defining a hermetic sealing area, a metallized layer formed on the peripheral region of the ceramic substrate, and a solder layer formed on the metallized layer for hermetic sealing of the package. The method comprises the steps of applying a molten solder to the metallized layer in such a manner that the molten solder vary in surface tension and thereby making the solder layer vary in thickness.

According to a further aspect of the present invention, the method comprises the steps of making the metallized layer vary in width and applying a molten solder to the metallized layer for thereby making the solder layer vary in thickness by the effect of a variation of a surface tension of the molten solder applied to the metallized layer.

The above structures and methods are effective for solving the above noted problems inherent in the prior art device.

It is accordingly an object of the present invention to provide a novel and improved ceramic lid which can be produced with ease and at a low cost, notwithstanding that it is devised so as to be capable of assuredly preventing spreading of solder during hermetic sealing of a package.

It is a further object of the present invention to provide a method of producing a ceramic lid of the above described character.

DETAILED DESCRIPTION OF THE PREFERRED EMBODIMENTS

Figure 1:
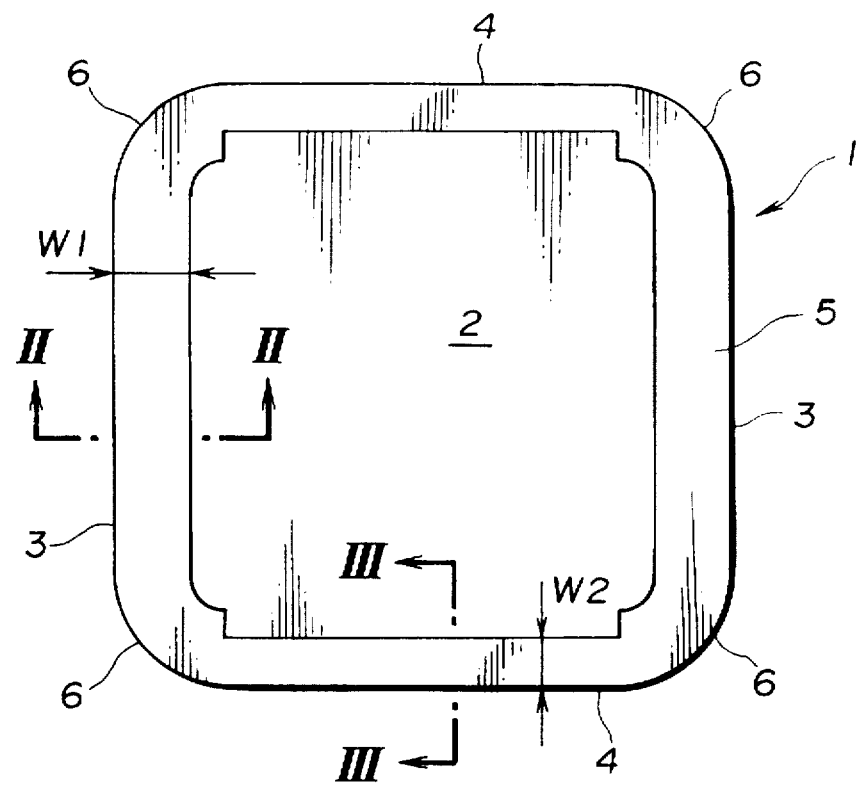
FIG. 1 is a plan view of a ceramic lid according to an embodiment of the present invention.
Figure 2:
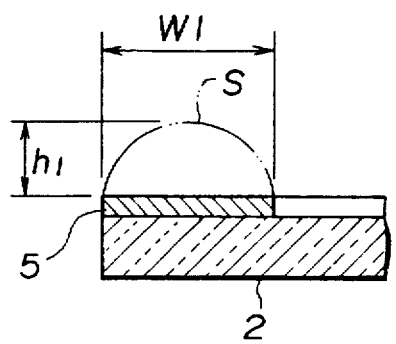
FIG. 2 is an enlarged sectional view taken along the line II—II of FIG. 1.
Figure 3:
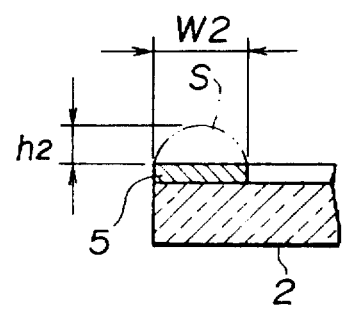
FIG. 3 is an enlarged sectional view taken along the line III—III of FIG. 1.

Referring first to FIGS. 1 to 3, a lid according to an embodiment of this invention is generally designated by 1 and includes a ceramic substrate 2 in the form of a nearly square plate of the length of the side of about 27 mm and of the thickness of about 1 mm and a metallized layer 5 of a hollow rectangular configuration formed on a peripheral region of the ceramic substrate 2, i.e., formed so as to extend along a pair of first parallel sides 3 and a pair of second parallel sides 4 of the ceramic substrate 2, to serve as an undercoat for forming thereon an integral heat fusible layer or solder layer. More specifically, the metallized layer 5 is so formed as to satisfy the relation of W1>W2 where W1 is the width of portions of the metallized layer 5 extending along the first pair of sides 3 of the ceramic substrate 2 and along the corners between the first and second pairs of sides 3 and 4, and W2 is the width of portions of the metallized layer 5 extending straightly along the second pair of sides 4. In this embodiment, W1 is 1.8 mm and W2 is 1.35 mm. The ceramic substrate 2 is formed from a ceramic material containing 90% alumina by a known process such as pressing and baking. The metallized layer 5 is a thick film and formed from a Ag(silver)-Pd(lead) paste by screen printing the paste on the ceramic substrate 2 and firing it.

The above described lid 1 is immersed in a molten solder and then pulled out therefrom to allow a solder to adhere to the metallized layer 5 only. The solder is then cooled and solidified, whereby a desired solder layer "S" can be formed on the metallized layer 5. When the solder layer "S" is formed on the metallized layer 5 in the above manner, the thickness h1 of a solder layer portion formed on the wider metallized layer portion of the width W1 differs from that h2 of a solder layer portion formed on the narrower metallized layer portion of the width W2 , that is, the thickness h1 was 200 μm and the thickness h2 was 140–160 μm. That is, grooves 7 of the depth of 40–60 μm, which is equal to the difference in thickness (h1–h2) between the solder layer portions, were automatically formed in the solder layer. In this connection, the solder used in this embodiment has a composition consisting of 85 wt.% Pb(lead), 5 wt.% Sn(tin), 7 wt.% Bi(bismuth) and the remainder of Ag(silver) and In(indium), and has a solidus line temperature of 240° C. and a liquidus line temperature of 280° C.

Figure 4:
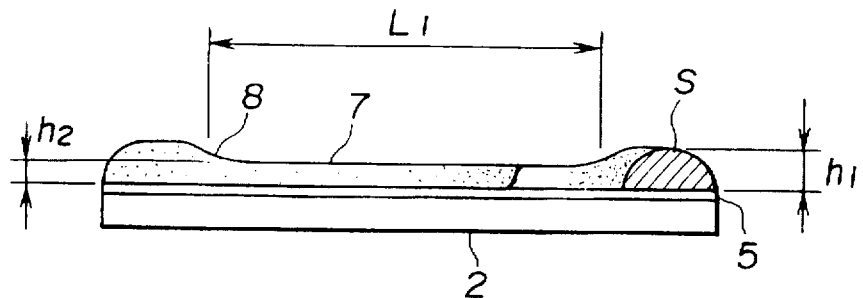
FIG. 4 is a side elevational, partly sectioned view of the ceramic lid of FIG. 1, together with a solder layer formed on a metallized layer thereof.

By this, the portions of the solder layer "S" adhering to the portions of the metallized layer 5 extending along the pair of opposite sides 4 have the upper surfaces which are relatively lower in height than the surfaces of the remaining portion of the solder layer "S", so that the portions L1 of the solder layer "S" extending along the pair of opposite sides 4 form grooves or gas discharge passages 7 (refer to FIG. 4).

Figure 13:
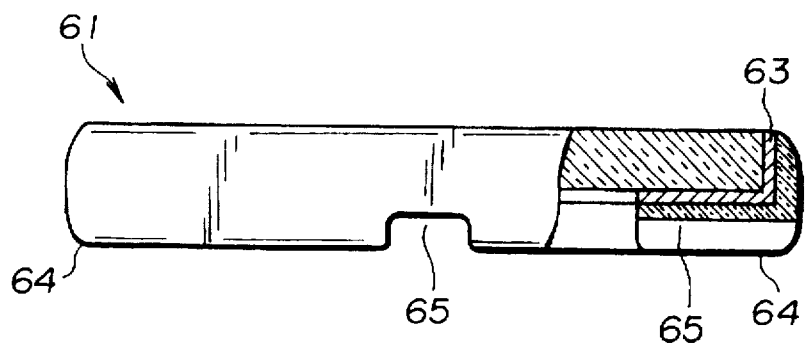
FIG. 13 is a side elevational, partly sectioned view of a prior art lid adapted to prevent spreading of solder.
Figure 14:
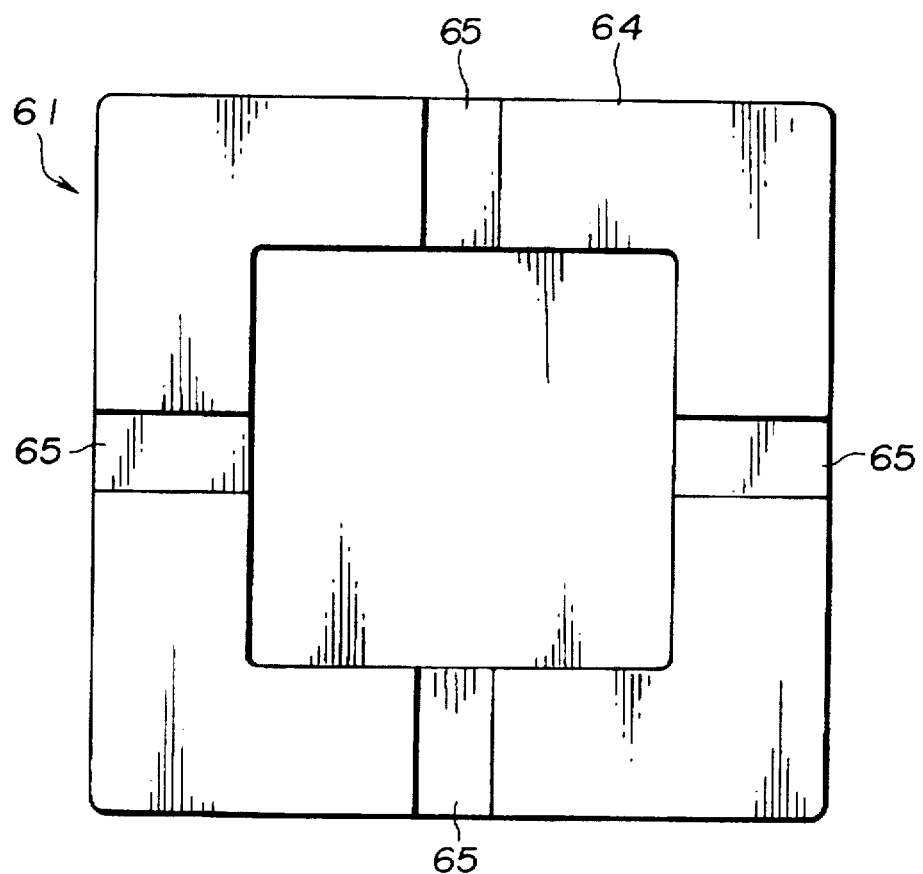
FIG. 14 is a plan view of the prior art lid of FIG. 13.

The metallized layer 5 is effective for causing connecting portions 8 between the portions of different heights of the solder layer "S" to be smoothly shaped or configured as shown in FIG. 4 so that at such connecting portions there is not formed any sharp edge which is otherwise formed in case of the method in which the groove is formed by pressing a die against the solder layer (refer to FIG. 13), thus making it possible for the grooves to be filled up with a molten solder with ease and efficiency and therefore making it possible to prevent a void or voids from remaining in the solder layer "S" with efficiency.

In the foregoing, while it has been described and shown that the solder layer is formed on a metallized layer by a dipping process, it may be obtained by printing a solder paste on the metallized layer or setting a predetermined solder preform on the metallized layer, heating it to reflow and solidifying it.

The lid formed with the solder layer in the above manner was used for hermetically sealing a package, and it was observed that the lid of this invention can prevent spreading of solder with efficiency. In this connection, when the lid of this invention is placed on the package, the grooves 7 of the solder layer "S" cooperate with the surface of the metallized layer of the package base to define therebetween gas discharge passages (i.e., air outlets or vents), thus making it possible to discharge through the passages the expanded gas within the package to the outside with efficiency.

The lid of this invention was used for hermetic sealing of a package and tested for the occurrence rate of spreading of solder. To this end, the lid of this invention was compared with a comparative sample in which the metallized layer is of the uniform width (i.e., W1=W2). Further, various samples of this invention which have the same width W1 (i.e., 1.8 mm) but have different widths W2 that are sized so that W1/W2 is 3/2 or 2/1 were prepared to observe the effect of the lid of this invention. In this connection, one hundred samples were prepared for each type. The test result is shown in Table I.

TABLE I

| Ratio of W1 to W2 | Difference in Thickness (h1–h2) of Solder Layer between W1 and W2 Metallized Layer Portions | Occurrence Rate of Spreading of Solder |
| --- | --- | --- |
| 1 (Comparative sample) | 0–20 μm | 30% |
| 4/3 | 40–60 μm | 4% |
| 3/2 | 50–80 μm | 0% |
| 2/1 | 90–120 μm | 0% |

As shown in Table I, when the width of the metallized layer is uniform (W1=W2), the difference in the thickness of the solder layer is comparatively small so as to range from 0 to 20 μm, so that occurrence of spreading of solder was observed in 30% of the examples. In contrast to this, in the samples of this invention, the occurrence rate of spreading of solder was markedly reduced to 4%. Further, in case of the samples of the ratio of W1/W2 of 3/2 or 2/1, the difference in thickness was in the range from 50 μm to 120 μm and there was not any occurrence of spreading of solder observed in them. From the above test result, it will be understood that the lid of this invention is capable of preventing occurrence of spreading of solder during hermetic sealing of the package with efficiency.

Figure 5:
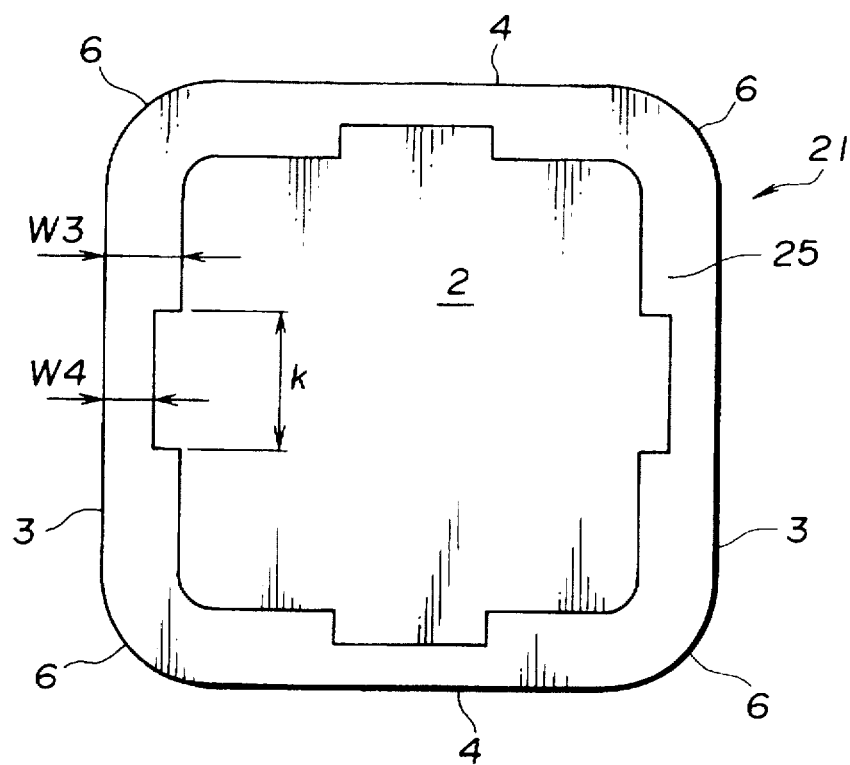
FIG. 5 is a view similar to FIG. 1 but shows a further embodiment of the present invention.
Figure 6:
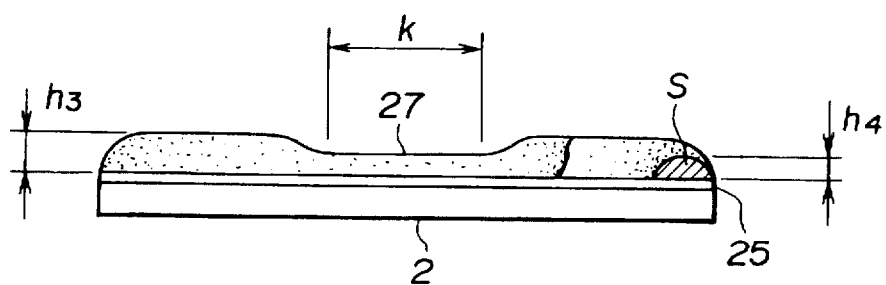
FIG. 6 is a view similar to FIG. 4 but shows the embodiment of FIG. 5.

Referring to FIGS. 5 and 6, a further embodiment of the present invention will be described. This embodiment is substantially similar to the previous embodiment of FIGS. 1 to 4 except for the pattern or shape of the metallized layer 25, so the similar parts or portions are designated by similar reference characters and repeated description thereto are omitted for brevity.

In this embodiment, the metallized layer 25 is formed with a notch "k" at an inner peripheral edge of a central portion of each side so as to be narrower at the central portion of each side. More specifically, the metallized layer 25 is of the uniform width W3 of 1.8 mm at the corner portions and at the portions next to the central portions of each sides and of the width W4 of 1.35 mm at the central portions of each sides.

By providing the solder layer "S" to the metallized layer 25 in the similar manner described with respect to the previous embodiment of FIGS. 1 to 4, the thickness h4 of a narrower width W4 portion of the solder layer "S" becomes smaller as compared with the thickness h3 of a wider width W3 portion of the solder layer "S", so that grooves 27 are formed at the narrower width W4 portions of the solder layer "S" to serve as gas discharge passages during hermetic sealing of a package. In this embodiment, since the four grooves 27 are formed with intervals therebetween, discharge of the gas, even when irregular melting of the solder may close one of the grooves 27, can be obtained until all of the passages are closed. Accordingly, in case a furnace with a belt conveyer is used for carrying out hermetic sealing of a package, the setting of the direction of the lid or the arrangement of the lid with respect to the direction of movement of the belt conveyer can be attained with ease.

In order to recognize the effect of such a pattern of the metallized layer, samples of this embodiment which have the same width W1 (i.e., 1.8 mm) but have different widths W2 that are sized so that the ratio of W1/W2 is 3/2 or 2/1 were prepared. The samples were then formed with solder layers by a dipping process, and the difference in height of the upper surface of the solder layers were observed. The samples were also tested for the occurrence rate of spreading of solder during hermetic sealing of the packages. The test result is shown in Table II. In the meantime, the thickness h3 of the solder layer at the wider width W3 portion of the metallized layer 25 is about 200 μm.

TABLE II

| Ratio of W3 to W4 | Difference in Thickness (h3–h4) of Solder Layer between W3 and W4 Metallized Layer Portions | Occurrence Rate of Spreading of Solder |
| --- | --- | --- |
| 1 (Comparative sample) | 0–20 μm | 30% |
| 4/3 | 30–60 μm | 6% |
| 3/2 | 50–70 μm | 0% |
| 2/1 | 80–120 μm | 0% |

From Table II, it will be seen that this embodiment, even when the ratio of W3/W4 is 4/3, can attain a marked difference in thickness of about 30–60 μm and can considerably reduce the occurrence rate of the spreading of the solder to 6%. Further, when the ratio of W3/W4 increases beyond 3/2, the difference in thickness (h3–h4) of about 50 μm–120 μm can be attained, and there was not observed any spreading of solder. In this embodiment, it is preferable that the notch "k" is of the length of 3 mm or larger. As described above, the thicker and thinner portions of the solder layer are connected smoothly, i.e., a transition or connecting portion between the thicker and thinner portions of the solder layer changes in shape smoothly therebetween, so that unless the length of the notch "k" is larger than a certain value the difference in width (W3–W4) cannot cause an effective difference in thickness of the solder layer, thus causing a probability that gas discharge passages of a sufficiently large flow area cannot be attained. However, the length of the notch "k" is not limited to 3 mm or larger but can be designed variously depending upon variations of the size of the metallized layer.

Figure 7:
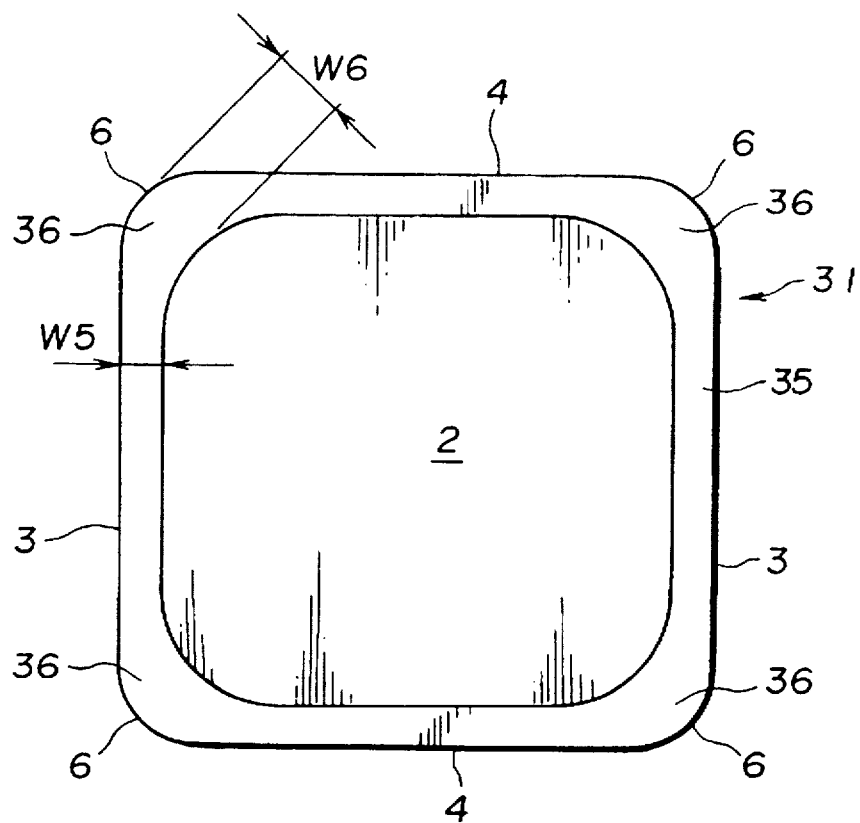
FIG. 7 is a plan view similar to FIG. 1 but shows a further embodiment of the present invention.

Referring to FIG. 7, a further embodiment of the present invention will be described. In this embodiment, differing from the pattern of the metallized layer of the previous embodiments in which the width of the metallized layer is varied at a straight portion of each side, the metallized layer 35 of the lid 31 is formed to have such a pattern as to be wider at each corners 6.

As shown in FIG. 7, at each corner 6 of the metallized layer 35 the adjacent two inner peripheral edges are connected by a curved edge of a relatively large radius of curvature so that the width W6 of each corner portion 36 of the metallized layer 35 is larger than the width W5 of the straight portion of each side 3 or 4. In this embodiment, the width W5 is uniform and 1.8 mm, the ratio of W5/W6 is 3/4 and the width W6 is 2.4 mm. When this embodiment was formed with a solder layer in the similar manner described with respect to the previous embodiment of FIGS. 1 to 4, the thickness of the solder layer at the width W5 portion of the metallized layer 35 was 200 μm whilst the thickness of the solder layer at the corner portions 36 (i.e., the width W6 portions) was 270 μm, so that the difference in the thickness of about 70 μm was obtained. That is, in this embodiment, almost the entire of the straight portion of each side is adapted to form a groove (gas discharge passage). This embodiment was tested for the occurrence of the spreading of solder in the similar manner described with respect to the previous embodiments, and there was not observed any occurrence of the spreading of the solder.

Figure 8:
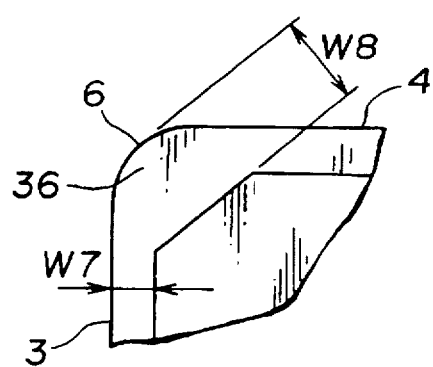
FIG. 8 is a fragmentary plan view of a ceramic lid assembly according to a further embodiment.

FIG. 8 shows a further embodiment which differs from the previous embodiment of FIG. 7 in that at each corner portion 36 the adjacent two straight inner peripheral edges are connected by a straight line edge inclining 45 degrees with respect to the straight inner peripheral edges so that each corner portion 36 has an increased width. The width W7 of the straight portion at each side of the metallized layer is 1.8 mm, whereas the width W8 of the corner portion 36 is sized so that the ratio of W7/W8 is 2/3. The lid assembly of this embodiment was formed with a solder layer in the similar manner described with respect to the previous embodiment of FIGS. 1 to 4, and it was found that the average thickness of the solder layer at the uniform width W7 straight portion of the metallized layer 35 was 200 μm and the thickness of the solder layer at the corner portion 36 of the metallized layer was about 300 μm, so that the difference in thickness of about 100 μm was obtained and the spreading of the solder during the hermetic sealing of the package could be prevented with efficiency.

Figure 9:
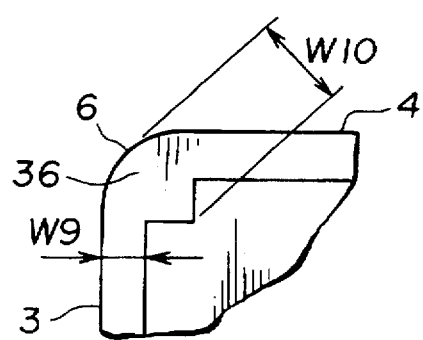
FIG. 9 is a view similar to FIG. 8 but shows a further embodiment.

FIG. 9 shows a further embodiment which differs from the previous embodiment of FIG. 7 in that at each corner portion 36 the adjacent two straight inner peripheral edges are connected by an angled or bent edge which is bent at an angle of 90 degrees and protrudes inwards of the lid. The width W9 of the straight portion at each side of the metallized layer is 1.8 mm and the width W10 of the corner portion is sized so that the ratio of W9/W10 is 1/2. The lid of this embodiment was formed with a solder layer in the manner described with the previous embodiment of FIGS. 1 to 4, and it was found that the average thickness of the solder layer at the uniform width W9 straight portion of the metallized layer was 200 μm and the thickness of the solder layer at the corner portion 36 of the metallized layer was about 400 μm, so that the difference in thickness of about 200 μm was obtained and the spreading of the solder during the hermetic sealing of the package could be prevented with efficiency.

While the above described embodiments have been described and shown as having a varying width of the metallized layer by means of recesses or projections provided to the inner periphery of the metallized layer, the width of the metallized layer may be varied by providing the recesses or projections to the outer periphery of the metallized layer. Further, while the metallized layers in the embodiments of FIG. 1 and 5 have been described and shown as being formed into a stepped pattern shape at the portions extending along each sides of the lid by means of straight lines or edges, the width of the metallized layer may be varied by using curved or arcuated edges in such a manner that recessed portions and protruded portions are alternately formed at the periphery of the metallized layer for thereby making the metallized layer be varied in width at some places and with some intervals. Further, in case of varying the width of the metallized layer by means of edges consisting of straight-line edges, the periphery of the metallized layer may be formed into a pattern consisting of continuous V-shapes, i.e., a saw-toothed shape.

Figure 10:
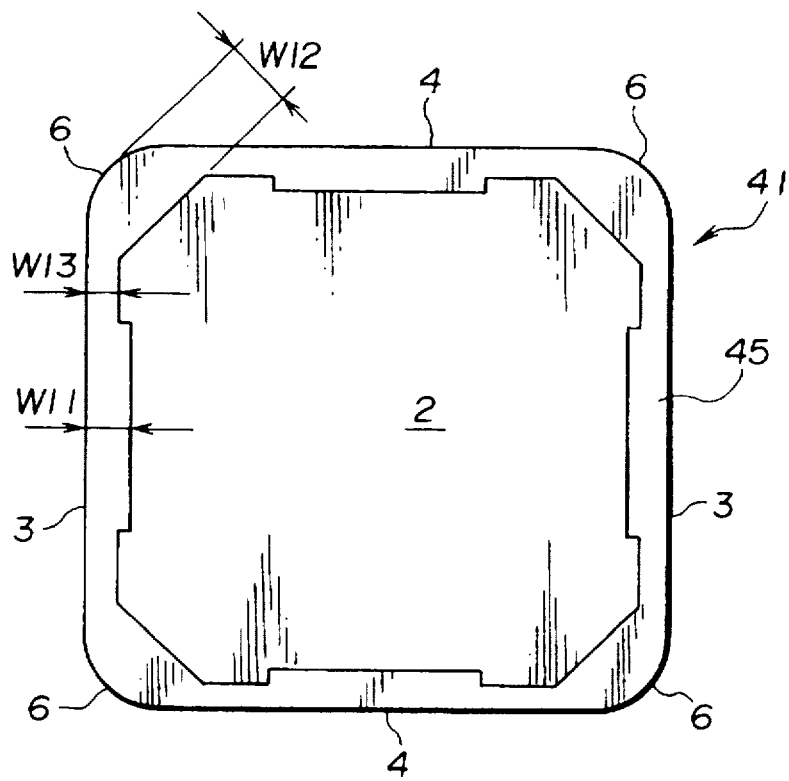
FIGS. 10 and 11 are views similar to FIG. 1 but show further embodiments, respectively.
Figure 11:
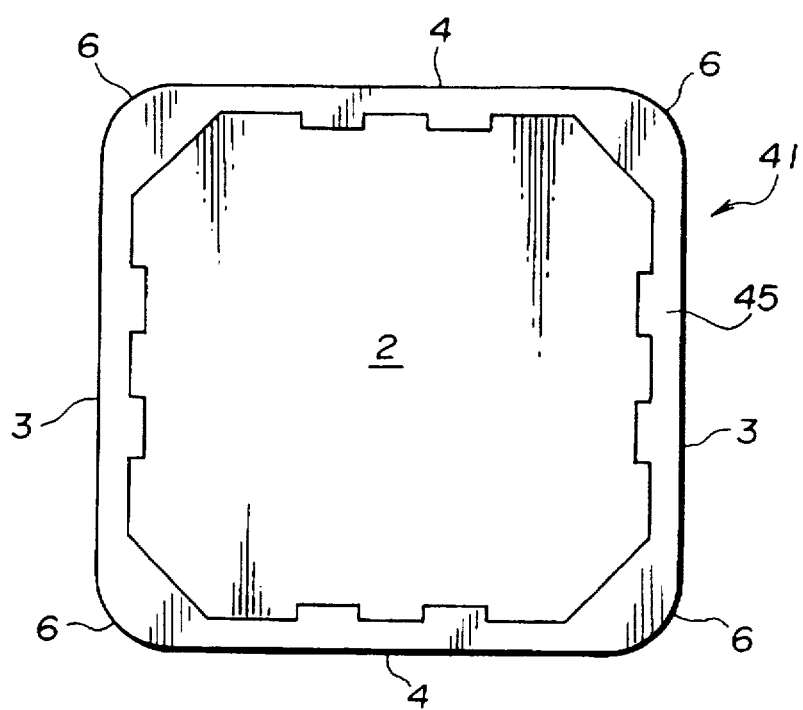
Figure 12A:
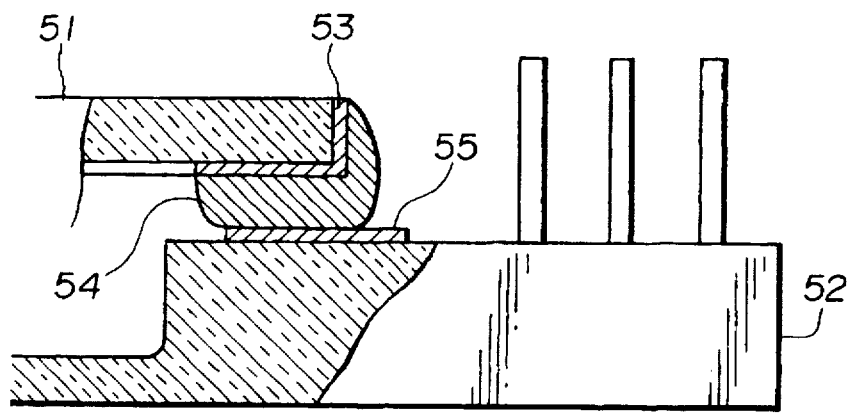
FIG. 12A is a side elevational, partly sectioned view of a portion of a prior art semiconductor package hermetically sealed by a ceramic lid.
Figure 12B:
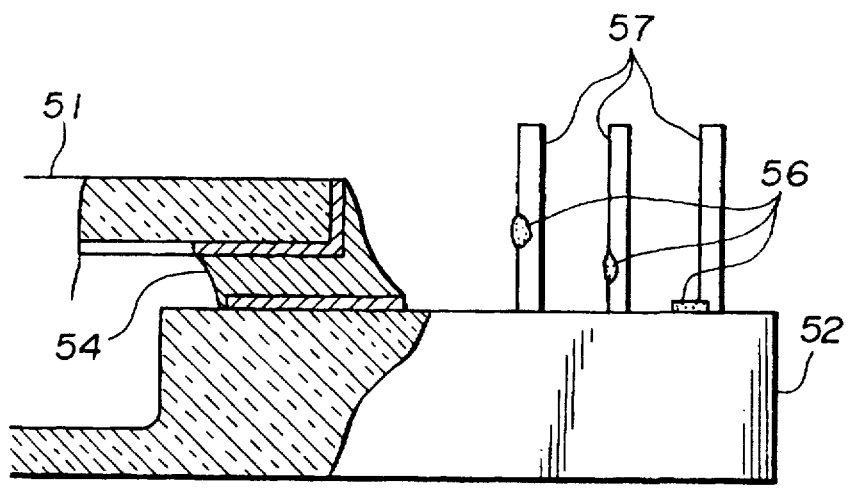
FIG. 12B is a view similar to FIG. 12A but shows the package in the state that a portion of a solder is spread to adhere to external leads during soldering.

Further, while in the embodiments of FIG. 1 and FIG. 5 the metallized layer has been described and shown as having two kinds of widths W1 and W2, it may be varied in width so as to have three or more kinds of widths. Further, as shown in FIG. 10, the lid 41 may be formed with a metallized layer 45 of such a pattern that is obtained by the combination of the embodiment of FIG. 5 and the embodiment of FIG. 8. That is, the metallized layer 45 includes straight portions of the width W11, corner portions 6 of the width W12 which is larger than W11, and portions connecting between the corner portions 6 and the straight portions and of the width 13 which is smaller than the width W12, so that the difference in width between the corner portions 6 and the portions adjacent thereto, i.e., the difference between W12 and W13 can be increased and a large difference in thickness between the solder layer portions formed thereon can be obtained. In case of this pattern of the metallized layer, an excess amount of the solder at the wider corner portion of the metallized layer is caused to flow into the thinner solder layer portion at the narrow width of the metallized layer located just adjacent thereto so that an advantage that the sealed portion of the package is smooth and uniform can be obtained. Further, as shown in FIG. 11, the straight metallized layer portions 3 and 4 can be further provided with narrower sections at the central areas thereof.

According to the present invention, the metallized layer formed on the lid around the periphery of the surface facing the package base is partially reduced in width at some places and with some intervals, so that by the effect of the difference in width there is caused a difference in the surface tension of the solder formed on the metallized layer by means of a dipping process, etc., thus causing the difference in thickness of the solder layer formed on the metallized layer for thereby forming one or a plurality of recesses or grooves serving as gas discharge passages at one or a plurality of places of the solder layer. The pattern of the metallized layer consisting of narrower portions and wider portions may be designed depending upon the kind and the size of lid and the composition of the solder used.

A larger difference in the thickness of the solder layer makes it possible to attain a more efficient gas discharge. Accordingly, it is preferable that the difference in width of the metallized layer is designed so as to be as large as possible. However, when the difference in width of the metallized layer is too large, a lack in the amount of solder at the solder layer portion formed with the groove will possibly be caused, resulting in a possibility of occurrence of voids or a defective in the appearance of the sealed portion of the package. So, the difference in width of the metallized layer is designed depending upon the kind of lid, etc.

The metallized layer in the lid of this invention can be of any kind so long as it can serve as an undercoat for forming thereof a solder layer. For example, it may be prepared by printing a Mo(molybdenum) paste on a ceramic lid substrate and baking it to be metallized and thereafter plating the metallized layer with Ni and Au, or it may be prepared by printing a W(tungsten) paste on a green sheet and baking them and thereafter plating it with Ni and Au. The solder may be selected variously according to the kind of lid or package base, that is, Au-Sn alloy solder (low temperature gold solder) other than the Pb-Sn solder described above.

From the foregoing, it will be understood that in the ceramic lid for a semiconductor package according to the present invention the metallized layer formed around the periphery of the lid to serve as an undercoat for forming thereon a solder layer is reduced in width partially and with intervals, whereby when a solder is caused to adhere to the metallized layer by a dipping process or by reflow the thickness of the solder at the wider metallized portion becomes larger than that at the narrower metallized portion due to the surface tension of the solder. By cooling and solidifying the solder, a solder layer having an upper surface of a varying height or a varying thickness in the circumferential direction of the lid can be obtained automatically. That is, with the lid of this invention, a difference in thickness of the solder layer is automatically caused so that the relatively thinner portions of the solder layer are formed into grooved or recessed shapes, so that grooves for serving as gas discharge passages can be obtained without requiring additional processes or works for forming such grooves but with the same process as the prior art process for forming a flat solder layer.

As a result, according to the present invention, a lid which is capable of preventing occurrence of the spreading of solder during hermetic sealing of the package can be obtained with ease and at a low cost. Further, the present invention makes it possible to obtain a lid of a high quality since it does not require to partially melt the solder layer by means of a hot knife and therefore it has a less possibility of causing oxidization and damage of the solder.

What is claimed is:

1. A ceramic lid for a semiconductor package, comprising:

a ceramic substrate having a peripheral region defining a hermetic sealing area;

a metallized layer formed on said peripheral region of said ceramic substrate; and a solder layer for hermetic sealing of the package, formed on said metallized layer;

wherein said metallized layer has at least one portion which differs in width from a remaining portion thereof such that said solder layer has one portion that differs in thickness from a remaining portion thereof at a location corresponding to said one portion of said metallized layer by the effect of a surface tension of said solder layer in a molten state, and the thickness of said solder layer varies smoothly at a transition from said one portion of said solder layer to said remaining portion of said solder layer.

2. A ceramic lid for a semiconductor package, comprising:

a ceramic substrate having a peripheral region defining a hermetic sealing area;

a metallized layer formed on said peripheral region of said ceramic substrate; and a solder layer for hermetic sealing of the package, formed on said metallized layer;

wherein said metallized layer has a plurality of first portions which differ in width from a remaining second portion thereof and which are arranged in intervals such that said solder layer has a plurality of first portions that differ in thickness from a remaining second portion thereof at locations corresponding to said first portions of said metallized layer by the effect of a surface tension of said solder layer in a molten state, and the thickness of said solder layer varies smoothly at a transition from each of said first portions of said solder layer to said second portion of said solder layer.

3. A ceramic lid for a semiconductor package, comprising:

a ceramic substrate having a peripheral region defining a hermetic sealing area;

a metallized layer formed on said peripheral region of said ceramic substrate; and a solder layer for hermetic sealing of the package, formed on said metallized layer;

wherein said metallized layer is made up of plurality of larger and smaller width portions which are arranged alternately such that said solder layer has a plurality of larger and smaller thickness portions at locations corresponding to said respective larger and smaller width portions of said metallized layer by the effect of a surface tension of said solder layer in a molten state, and the thickness of said solder layer varies smoothly at a transition from each of said larger thickness portions to said smaller thickness portions.

4. A ceramic lid for a semiconductor package, comprising:

a ceramic substrate having a peripheral region defining a hermetic sealing area;

a metallized layer formed on said peripheral region of said ceramic substrate; and a solder layer for hermetic sealing of the package, formed on said metallized layer; wherein said metallized layer has a pair of straight, smaller width portions at a pair of opposite sides thereof and a remaining portion of a larger width at another pair of opposite sides and corners thereof such that said solder layer has a pair of smaller thickness portions at locations corresponding to said respective smaller width portions of said metallized layer by the effect of a surface tension of said solder layer in a molten state, and the thickness of said solder layer varies smoothly at a transition to each of said smaller thickness portions.

5. A ceramic lid for a semiconductor package, comprising:

a ceramic substrate having a peripheral region defining a hermetic sealing area;

a metallized layer formed on said peripheral region of said ceramic substrate; and a solder layer for hermetic sealing of the package, formed on said metallized layer;

wherein said metallized layer has a reduced width portion at each side thereof such that said solder layer has reduced thickness portions at locations corresponding to said reduced width portions of said metallized layer by the effect of a surface tension of said solder layer in a molten state, and the thickness of said solder layer varies smoothly at a transition to each of said reduced thickness portions.

6. A ceramic lid for a semiconductor package, comprising:

a ceramic substrate having a peripheral region defining a hermetic sealing area;

a metallized layer formed on said peripheral region of said ceramic substrate; and a solder layer for hermetic sealing of the package, formed on said metallized layer;

wherein said metallized layer has an increased width portion at each corner thereof such that said solder layer has increased thickness portions at locations corresponding to said respective increased width portions of said metallized layer by the effect of a surface tension of said solder layer in a molten state, and the thickness of said solder layer varies smoothly at a transition to each of said increased thickness portions.

7. A ceramic lid for a semiconductor package, comprising:

a ceramic substrate having a peripheral region defining a hermetic sealing area;

a metallized layer formed on said peripheral region of said ceramic substrate; and a solder layer for hermetic sealing of the package, formed on said metallized layer;

wherein said metallized layer has a first increased width portion of a width W11 at each side thereof, a second increased width portion of a width W12 at each corner thereof, and a reduced width portion of a width W13 between said first and second increased width portions such that said solder layer has a first increased thickness portion, a second increased thickness portion and a reduced thickness portion at locations corresponding to said first and second increased width portions and said reduced width portion of said metallized layer, respectively, by the effect of a surface tension of said solder layer in a molten state, and the thickness of said solder layer varies smoothly at a transition from said reduced thickness portion to each of said first and second increased thickness portions; and wherein said width W11 is larger than said width W13 but smaller than said width W12.

* * * * *